(12) United States Patent
Subramanian et al.

(10) Patent No.: US 6,803,267 B1
(45) Date of Patent: Oct. 12, 2004

(54) SILICON CONTAINING MATERIAL FOR PATTERNING POLYMERIC MEMORY ELEMENT

(75) Inventors: Ramkumar Subramanian, Sunnyvale, CA (US); Christopher F. Lyons, Fremont, CA (US); Matthew S. Buynoski, Palo Alto, CA (US); Patrick K. Cheung, Sunnyvale, CA (US); Angela T. Hui, Fremont, CA (US); Ashok M. Khathuria, San Jose, CA (US); Sergey D. Lopatin, Santa Clara, CA (US); Minh Van Ngo, Fremont, CA (US); Jane V. Oglesby, Mountain View, CA (US); Terence C. Tong, Sunnyvale, CA (US); James J. Xie, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/614,484

(22) Filed: Jul. 7, 2003

(51) Int. Cl.[7] ............................................. H01L 21/336
(52) U.S. Cl. ...................................... 438/197; 438/706
(58) Field of Search ................................. 438/197, 623

(56) References Cited

U.S. PATENT DOCUMENTS

| | | | |
|---|---|---|---|
| 4,663,270 A | | 5/1987 | Potember et al. |
| 4,948,708 A | * | 8/1990 | Veenvliet et al. ........... 430/316 |
| 5,589,692 A | | 12/1996 | Reed |
| 6,055,180 A | | 4/2000 | Gudesen et al. |
| 6,272,038 B1 | | 8/2001 | Clausen et al. |
| 6,314,019 B1 | | 11/2001 | Kuckes et al. |
| 6,320,200 B1 | | 11/2001 | Reed et al. |
| 6,324,091 B1 | | 11/2001 | Gryko et al. |
| 6,348,700 B1 | | 2/2002 | Ellenbogan et al. |
| 6,528,815 B1 | * | 3/2003 | Brown et al. .................. 257/40 |
| 6,541,816 B2 | | 4/2003 | Ramsbey et al. |
| 6,555,436 B2 | | 4/2003 | Ramsbey et al. |
| 2003/0017623 A1 | * | 1/2003 | Li et al. ......................... 438/3 |
| 2004/0058552 A1 | * | 3/2004 | Higuchi ...................... 438/710 |

* cited by examiner

*Primary Examiner*—David Nelms
*Assistant Examiner*—Thao P. Le
(74) *Attorney, Agent, or Firm*—Amin & Turocy, LLP

(57) ABSTRACT

The present invention provides a method to fabricate an organic memory device, wherein the fabrication method includes forming a lower electrode, depositing a passive material over the surface of the lower electrode, applying an organic semiconductor material over the passive material, and operatively coupling the an upper electrode to the lower electrode through the organic semiconductor material and the passive material. Patterning of the organic semiconductor material is achieved by depositing a silicon-based resist over the organic semiconductor, irradiating portions of the silicon-based resist and patterning the silicon-based resist to remove the irradiated portions of the silicon-based resist. Thereafter, the exposed organic semiconductor can be patterned, and the non-irradiated silicon-based resist can be stripped to expose the organic semiconductor material that can be employed as a memory cell for single and multi-cell memory devices. A partitioning component can be integrated with the memory device to facilitate stacking memory devices and programming, reading, writing and erasing memory elements.

21 Claims, 11 Drawing Sheets

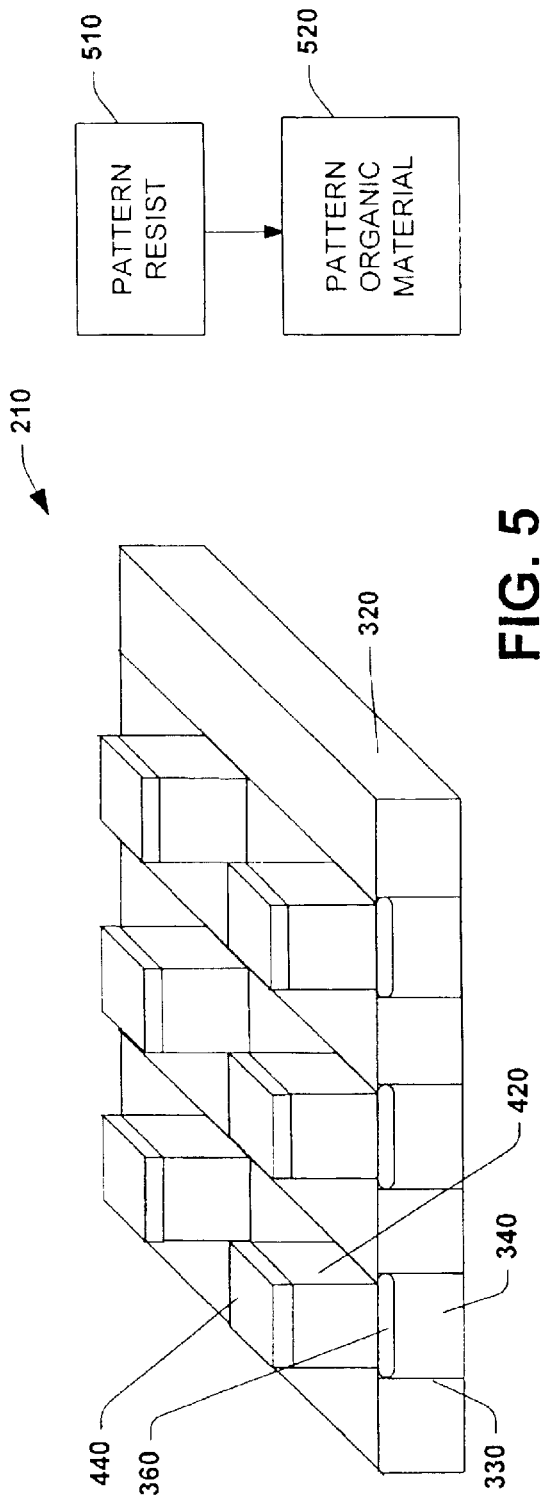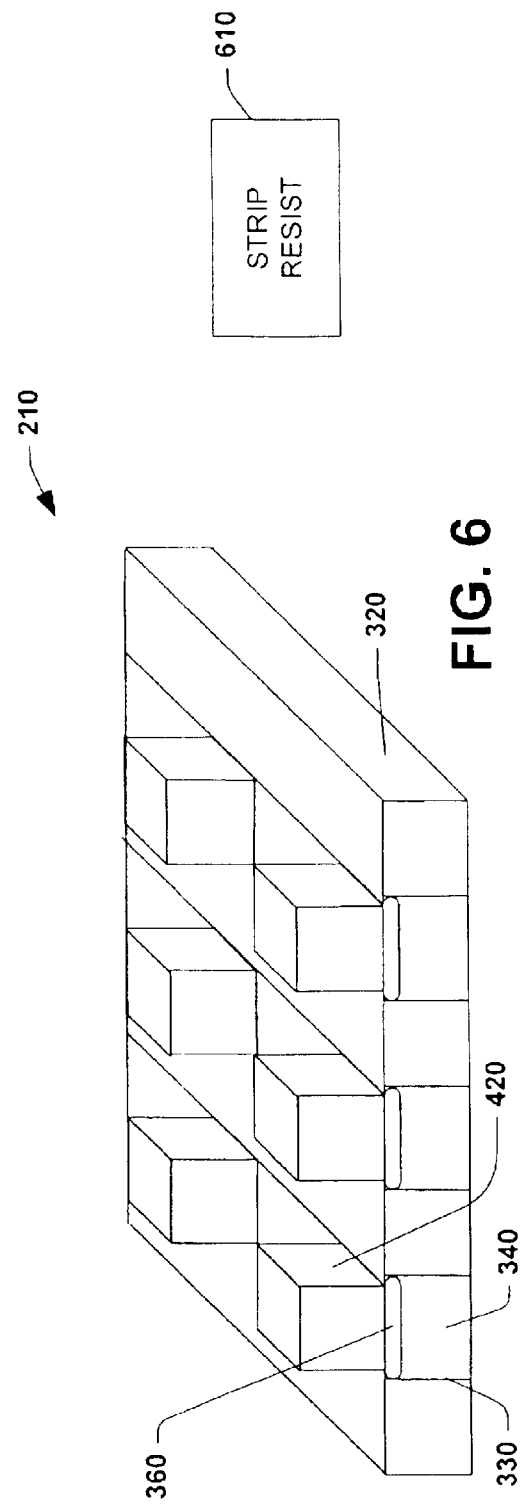

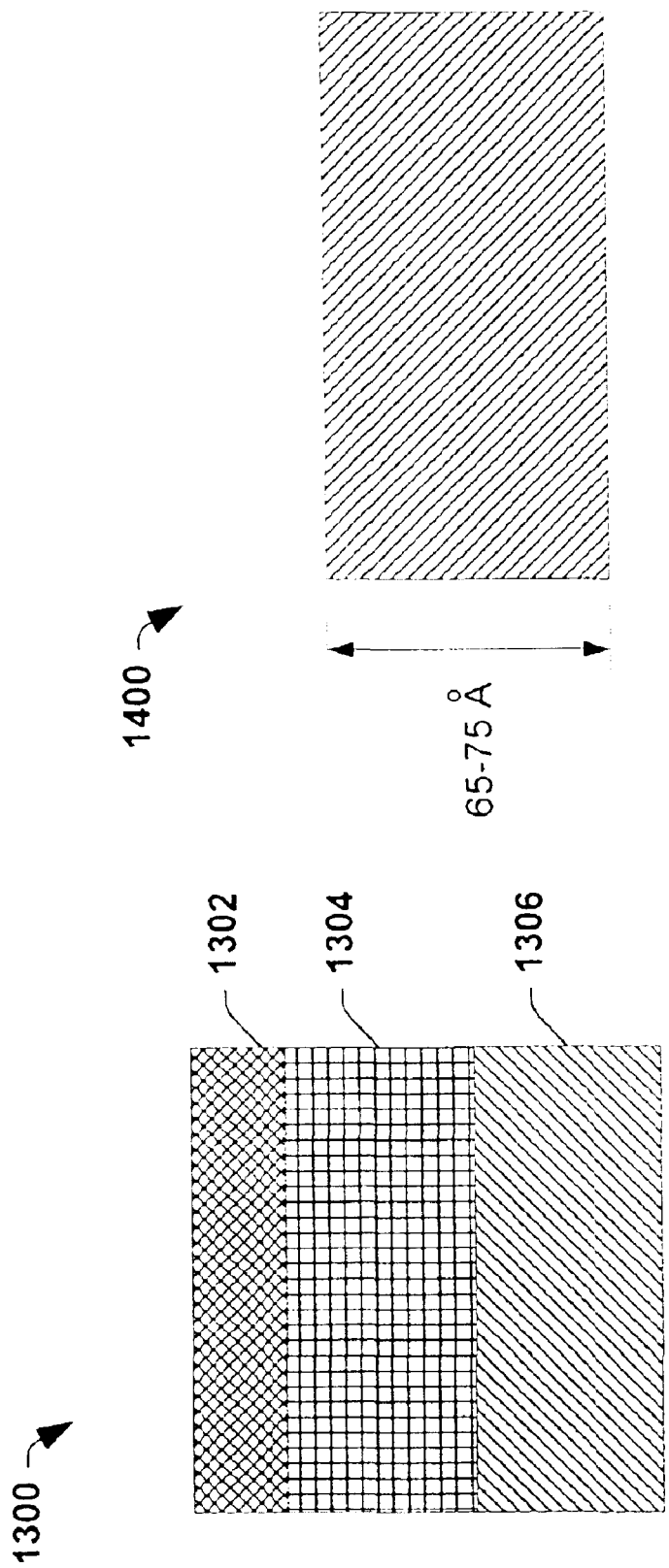

SILICON CONTAINING MATERIAL FOR PATTERNING POLYMERIC MEMORY ELEMENT

FIELD OF INVENTION

The present invention relates generally to organic memory devices and, in particular, to patterning organic memory devices.

BACKGROUND OF THE INVENTION

The volume, use and complexity of computers and electronic devices are persistently increasing. As computers continually become more powerful, new and improved electronic devices are continuously developed (e.g., digital audio players, video players). Additionally, the growth and use of digital media (e.g., digital audio, video, images, and the like) have further pushed development of these devices. This growth and development has vastly increased the amount of information desired/required to be stored and maintained for computer and electronic devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid-state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid-state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances, which are much smaller than the small minimum size, for example, one quarter the minimum size.

Scaling inorganic solid-state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely. Furthermore, applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. Furthermore, such device shrinkage for inorganic non-volatile memory devices while meeting increased performance demands is particularly difficult, especially while maintaining low costs.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates to systems and methods for fabricating an organic memory element and/or device wherein a silicon-based resist is employed to mitigate difficulties with pattering a carbon resist deposited over an organic semiconductor. Typically, a carbon resist is employed, and is adequate when utilized in conjunction with a silicon substrate, for example. However, patterning can be difficult when both the resist and the organic semiconductor are carbon-based because patterning techniques are not carbon selective.

The present invention mitigates issues associated with utilizing a carbon resist with an organic semiconductor, including the difficulties described above, by employing a silicon-based resist. Thus the present invention affords one or more methods to improve patterning and mitigates problems associated with employing a carbon resist with a carbon organic semiconductor.

The fabrication methods include forming an organic semiconductor as a layer and/or within a via in a layer, and subsequently depositing a silicon-based resist over the organic semiconductor layer wherein the silicon-based resist is then patterned utilizing a positive and/or negative resist technique. The fabrication methods can be employed to form one or more memory elements, serially and/or concurrently.

A formed organic semiconductor memory element can be employed as a memory cell, or a storage unit, to store information within a memory structure. Generally, a memory structure includes one or more electrodes (e.g., a top and a bottom electrode), a memory element and a passive material associated with at least one electrode. Information can be read, written and/or erased from the memory element by applying a suitable electrical potential across the memory structure (e.g., across electrodes).

In addition to a single cell memory structure, the methods described herein can be utilized to construct a multi-celled memory structure. In an aspect of the present invention, multiple memory elements can be formed within a structure, wherein the formation of the memory elements occurs serially and/or concurrently. In another aspect of the present invention, multiple structures (each structure with one or more memory elements) can be coupled through a component to facilitate programming and/or form an isolation barrier between memory structures.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5 is a flow diagram and associated structure illustrating a continuation of the process depicted in FIG. 4 for an organic memory structure in accordance with an aspect of the present invention.

FIG. 6 is a flow diagram and associated structure illustrating a continuation of the process depicted in FIG. 5 for an organic memory structure in accordance with an aspect of the present invention.

FIG. 13 is a block diagram of a passive layer that can be employed in an organic memory device in accordance with an aspect of the present invention.

FIG. 14 is a block diagram illustrating an organic polymer layer formed by a CVD process in accordance with an aspect of the present invention.

DETAILED DESCRIPTION OF THE INVENTION

Figure 1:
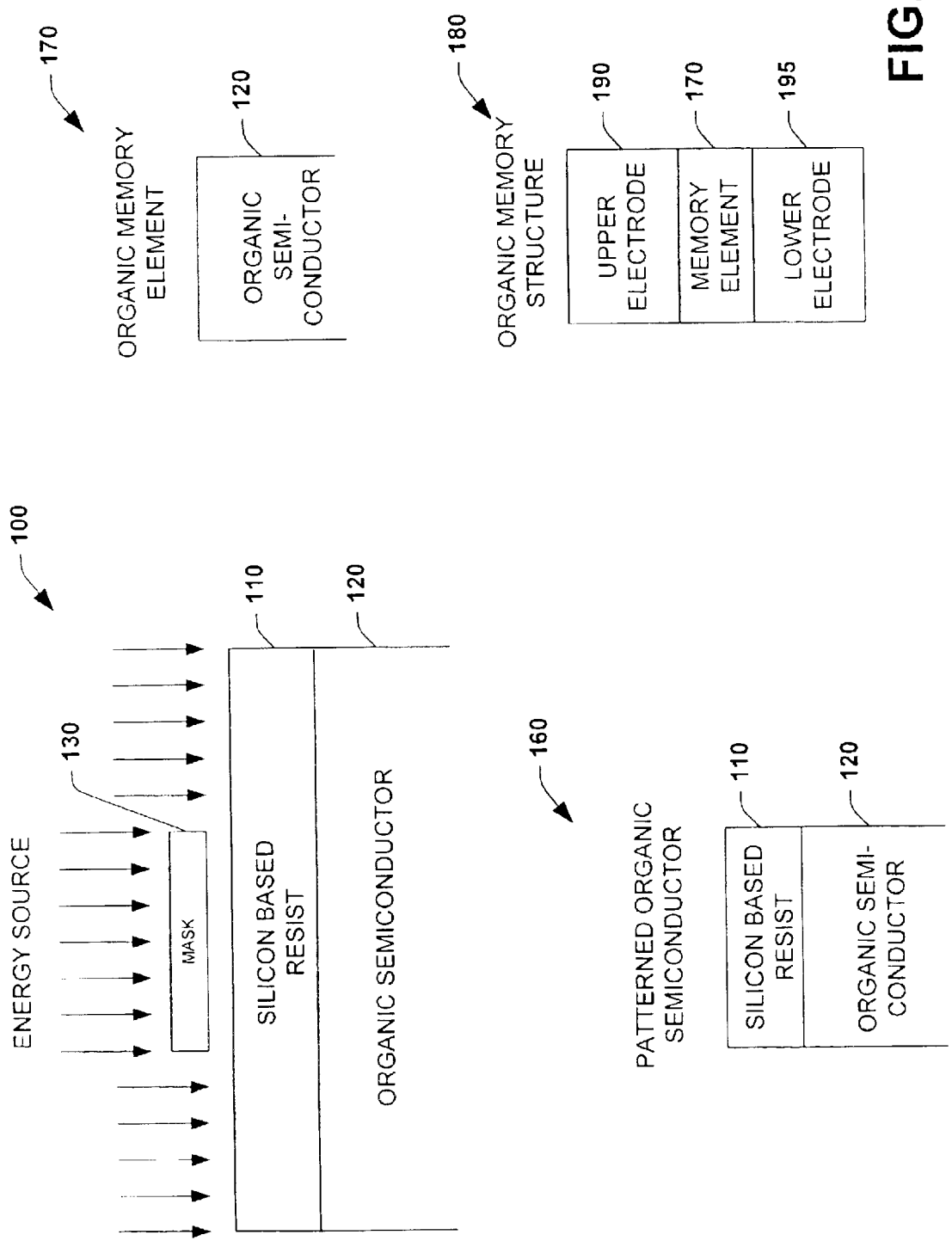
FIG. 1 illustrates an exemplary organic memory element in accordance with an aspect of the present invention.

The present invention relates to systems and methods for fabricating an organic memory cell/device employing a silicon-based resist. The methods include forming a lower conductive electrode on a substrate and/or within an opening in a dielectric, and thereafter applying an organic semiconductor material (e.g., an organic polymer) over the lower conductive electrode. A silicon-based resist is subsequently deposited over the organic semiconductor material via spin-on techniques, for example.

Silicon-based resists have silicon atoms within a polymer backbone, whereas most other resists have backbones that are substantially carbon. Silicon based resists include a polysiloxane and a silsesquioxane. Polysiloxanes have the general structure shown in Formula 1

Formula 1.

Polysiloxane wherein $R^1$ and $R^2$ are independently a hydrogen alkyl group having about 1 to about 6 carbon atoms, a flouroalkyl group having about 1 to about 6 carbon atoms, a norbornene group having about 8 to about 20 carbon atoms, or an aromatic group having about 6 to about 12 carbon atoms. Silsesquioxanes have the general structure shown in Formula 2.

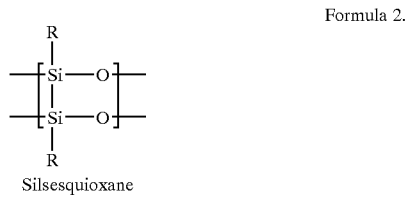

Formula 2.

Silsesquioxane

After silicon-based resist application, the silicon-based resist can be patterned utilizing a mask, light to irradiate a portion of the silicon-based resist, and a developer to remove the irradiated portion of the silicon-based resist. A non-irradiated portion of the silicon-based resist patterns the organic semiconductor material. Subsequently, the exposed organic semiconductor material is patterned via contacting an oxygen plasma with the exposed organic semiconductor material. The non-irradiated silicon-based resist is then stripped to expose the organic semiconductor material, forming an organic memory element. Thereafter, a dielectric and an upper conductive electrode are formed over the organic semiconductor material to form an organic memory cell. The above process can be employed to fabricate single and multi-celled memory devices, wherein a multi-celled memory device can be formed within a structure and/or formed within multiple structures coupled together.

The present invention further provides an organic memory device(s) fabricated employing the above process. The organic memory device can be formed with two or more electrodes having a selectively conductive medium between the electrodes, forming a memory cell. The selectively conductive medium can include a memory element coupled to a passive material, whereby the passive material provides access between an electrode and the memory element. The electrodes and selectively conductive medium can be formed in various locations within a memory device.

The memory element can be programmed by applying a voltage across the two or more electrodes to establish an impedance within the memory element. The impedance represents one or more bits of information that is retained within the memory element. For example, after storing a bit(s) of information, the voltage can be removed and the information remains stored within the memory element. Furthermore, the memory element does not require a refresh voltage to maintain the stored information. To retrieve information stored within a memory element, a current can be applied, and then the impedance stored in the memory element can be measured. Similar to programmed information, retrieved information from a memory element relates to one or more bits of information.

Referring initially to FIG. 1, organic memory element formation and utilization within an organic memory structure are illustrated in accordance with an aspect of the present invention. Beginning at reference numeral 100, a silicon-based resist 110 is deposited over an organic semiconductor 120, wherein the organic semiconductor 120 can be formed over a substrate, for example. The organic semiconductor 120 can be employed as an organic memory element of an organic memory structure, device and/or cell after patterning as described in more detail below.

A mask 130 is utilized in conjunction with an energy source (e.g., light, an electron beam, an ion beam and X-rays) to irradiate a portion of the silicon-based resist 110 that is not covered by the mask 130. Irradiation generally changes the characteristics of a resist so that it can be removed by suitable techniques without affecting non-irradiated resist.

It is to be appreciated that the mask 130 can be variously shaped and/or patterned. For example, in another aspect of the invention, a mask can be employed to cover two or more non-contiguous regions of a resist so that one or more non-contiguous regions can be irradiated with light. Furthermore, more than one mask can be employed to establish two or more non-contiguous covered regions of the resist.

The irradiated silicon-based resist 110 is patterned using an organic solvent or a hydroxide solution, pattering the organic semiconductor 120. The exposed organic semiconductor 120 is then patterned, resulting in the structure at reference numeral 160, which includes the non irradiated silicon-based resist 110 and the organic semiconductor 120 beneath the non irradiated silicon-based resist 110. The non irradiated silicon-based resist 110 is then stripped, leaving the exposed organic semiconductor 120 as illustrated at 170. The exposed organic semiconductor 120 can then be employed as an organic memory element, wherein the organic memory element can be utilized within an organic memory device, structure or cell to store information.

An exemplary organic memory structure employing an organic memory element fabricated with a silicon-based resist is illustrated at reference numeral 180. The organic memory structure is a single cell organic memory structure, however multiple organic memory elements can be formed to construct a multi-celled structure. For example, the silicon-based resist 110 can be patterned to provide more than one non-irradiated surface utilizing a variously shaped mask(s) as described above. Thereafter, suitable techniques can be employed to construct the more than one memory elements.

The organic memory structure 180 includes the organic memory element 170 between at least two electrodes, wherein the organic memory element 170 cooperates as a selectively conductive interface to operatively couple an upper electrode 190 and a lower electrode 195. Thus, if a suitable voltage is applied between the lower electrode 195 and the upper electrode 190, information (e.g., 1, 0) can be written, read and/or erased from the organic memory element 170. Typically, at least one electrode has a passive material (not shown) formed on the surface interfaced with the organic memory element 170 to facilitate access between the at least one electrode and the organic memory element 170.

Organic memory structure 180 can include various structures and/or layers. For example, various dielectric layers such as an Inter Layer Dielectric (ILD) can be employed. Dielectrics can be semiconductor material, for example, and/or substantially any type material having dielectric properties. In addition, a plurality of such organic memory structures 180 can be manufactured in accordance with an Integrated Circuit (IC) memory device.

FIGS. 2–7 illustrate methodologies and associated devices in accordance with an aspect of the present invention. For purposes of simplicity of explanation, the methodologies may be shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

It is noted that construction of a portion of a multi celled organic memory device is illustrated in FIGS. 2–7, wherein subsequent figures depict a continuation of a proceeding figure. Construction of a single celled organic memory device can be similarly performed. A detailed description presented below describes forming of one or more of a plurality of organic memory cells, wherein the plurality of organic memory cells is presented. Furthermore, exemplary materials and processes are described, thus a plurality of alternative materials and/or compounds can be employed in accordance with the present invention.

Figure 2:
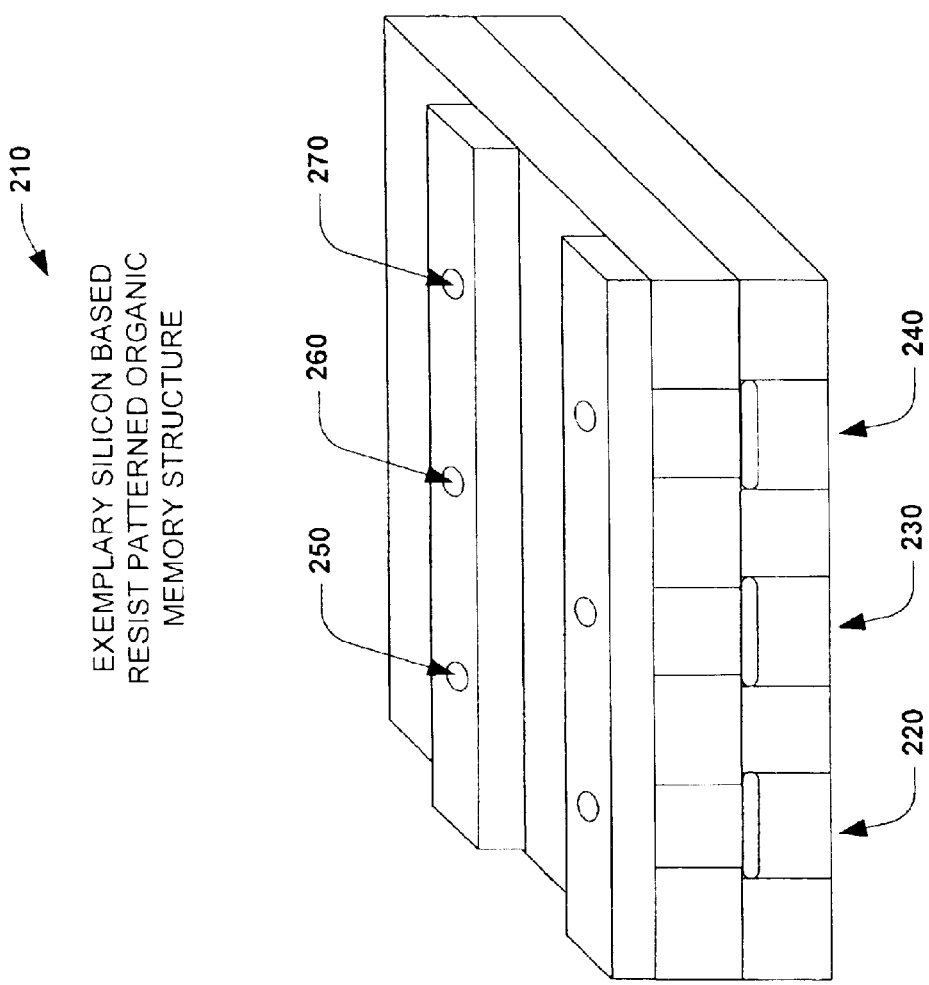
FIG. 2 is a portion of a multi-cell organic memory device in accordance with an aspect of the present invention.
Figure 3:
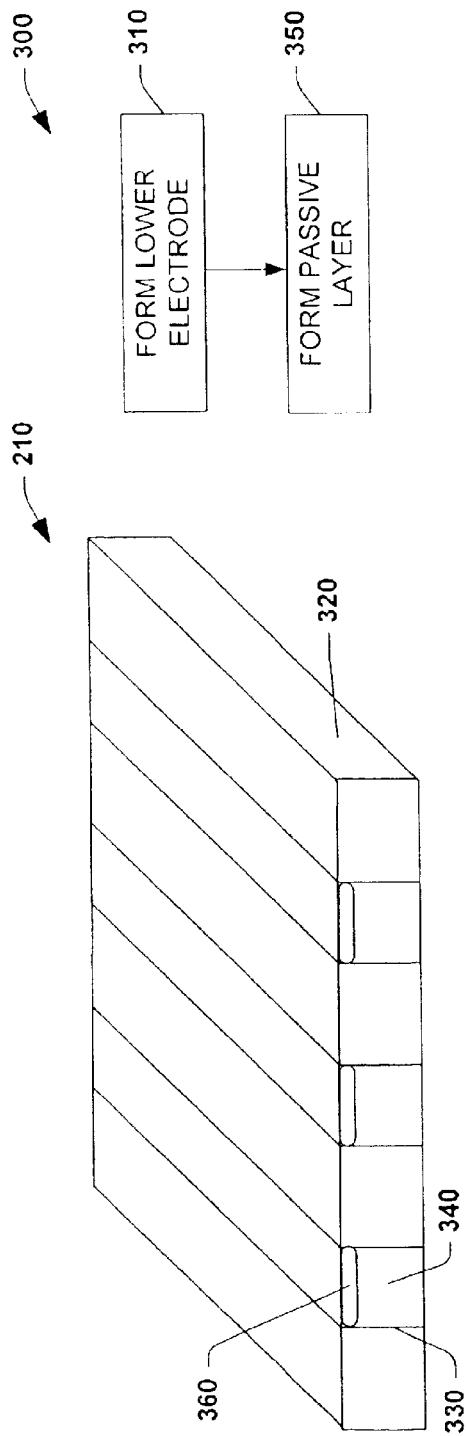
FIG. 3 is a flow diagram and associated structure illustrating a portion of a process for fabricating an organic memory device in accordance with an aspect of the present invention.

Turning to FIG. 2, a portion of a multi cell organic memory structure (hereafter memory device) 210 is illustrated in accordance with an aspect of the present invention. The memory device 210 includes a plurality of organic memory cells 220, 230, 240, 250, 260 and 270, wherein respective organic memory cells are similar to the organic memory cell 180 presented in FIG. 1. In particular, each cell includes two or more electrodes with an organic semiconductor for memory storage and a passive material for access between an electrode and the organic semiconductor. Furthermore, application of a voltage source across the electrodes provides memory cell read, write and erase functionality.

As noted above, the detailed description provides construction of at least one material memory cell (e.g., material memory cell 220). However, additional material memory cells can be formed serially and/or concurrently, employing suitable techniques. Proceeding to FIG. 3, a diagram 300 illustrates a portion of a process for fabricating a memory device 210 in accordance with the present invention. Beginning at reference numeral 310, a lower (e.g., a first) electrode can be formed in accordance with a single or dual damascene process within a dielectric layer(s) (e.g., ILD layer).

A dielectric layer is illustrated at 320 of the memory structure 210. For purposes of illustration, the dielectric layer 320 is depicted as a bottom layer. However, the dielectric layer 320 can be formed above other layers (e.g., other dielectrics and/or electrodes) and can form more than one layer. In addition, the dielectric 320 can be formed in various shapes, for example, uniform as presented and/or non-uniform with a varying thickness.

A channel 330 or other type of opening can be formed in the ILD layer 320 for an electrode. The channel 330 can be formed in accordance with a lithographic etch technique and/or other process for removing portions of the ILD layer 320. The channel 330 is presented as a rectangular volume, however various shapes can be utilized. For example, the channel 330 can be triangular and/or any geometrical shape. Furthermore, the channel 330 can extend the height and depth of the dielectric (e.g., as presented) and/or extend to various other distances, for example various heights, widths, and depths of the dielectric. Moreover, when multiple channels are formed for multiple electrodes, the channels can be formed according to a suitable shape for a corresponding electrode. Thus, a channel can be like other channels or uniquely shaped. When the channel 330 is established, a lower electrode 340 can be formed within the channel 330.

Referring now to reference numeral 350, a passive material such as copper sulfide (e.g., $Cu_{2-x}S_y$) is formed over the lower electrode 340. A passive material is illustrated at 360 of the memory device 210. As illustrated, the passive material 360 and the electrode 340 reside within the channel 330 and the ILD layer 320. However, the electrode 340 can be formed to encompass substantially the volume of the channel 330. Thereafter, a dielectric (not shown) can be formed over the dielectric 320 wherein a via or opening (not shown) for the passive material 360 can be formed for deposition of the passive material 360 over the electrode 340. Likewise, the opening for the passive material 360 can be variously shaped.

Figure 4:
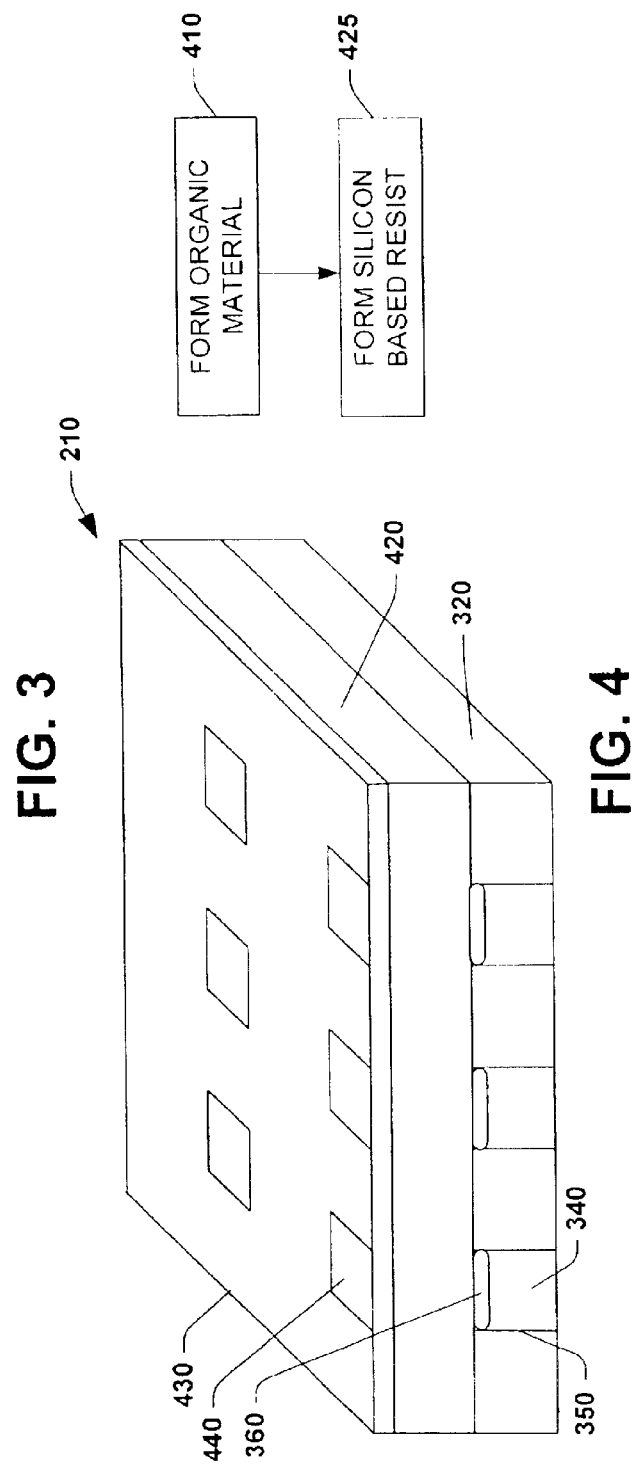
FIG. 4 is a flow diagram and associated structure illustrating a continuation of the process depicted in FIG. 3 for an organic memory structure in accordance with an aspect of the present invention.

Proceeding to FIG. 4, two or more layers formed over the dielectric 320 and the passive material 360 of the memory device 210 are illustrated in accordance with an aspect of the present invention. At reference numeral 410, a layer of an organic semiconductor is formed. The organic semiconductor is illustrated at 420 of the memory device 210. Similar to the dielectric 320, the organic semiconductor 420 can be a multi shaped layer. For example, the organic semiconductor 420 can be applied uniformly through techniques like applying multiple layers of the organic semiconductor 420 while varying deposition characteristics like volume and rate. Furthermore, techniques can be employed to mitigate bubble formation within and/or on top of the organic semiconductor 420. The organic semiconductor 420 can also be applied within trenches and/or openings in an existing layer as described in more detail below.

At reference numeral 425, a silicon-based resist is formed over the organic semiconductor 420. Suitable resists include a photoresist, an electron-beam resist, an ion-beam resist and an X-ray resist, and are typically applied by spin coating (e.g., spin-on) to achieve a uniform film coating, however other techniques like roller coating can be employed. The silicon-based resist (hereafter resist) is illustrated at 430 of the memory device 210. The resist 430 can include materials to achieve various properties. For example, materials can be included to enhance and/or suppress reflectivity. An antireflective material can also be applied as a subsequent layer.

The resist 430 can then be patterned, for example, by placing a mask (not shown) between the memory device 210 and a light (not shown) having a wavelength of about 248 nanometers or less, and irradiating the visible areas of the resist 430 (e.g., areas wherein the mask is not between the light and the resist) to change the characteristics of the resist such that the irradiated resist can be removed with a suitable developer. The mask can be a glass or polyester film with a patterned emulsion or metal film, for example. A non-irradiated region of the resist is illustrated at 440 of the memory device 210.

Irradiation methods include contact, proximity and projection techniques. Contact methods, which result in high resolution, entail placing the mask and the resist 430 in physical contact. Proximity methods provide less resolution, but mitigate damage caused by physical contact between the mask and the resist 430. For proximity methods, the mask is placed close to the resist 430. With projection methods, a lens is employed to project the mask pattern onto the resist 430.

FIG. 5 illustrates resist and organic semiconductor patterning in accordance with an aspect of the present invention. Generally, there are two types of resists: positive and negative. For positive resists, irradiation with light changes the chemical structure so that it becomes more soluble in developer solution. The irradiated resist is then washed away when the substrate is immersed in the developer, leaving an image or "positive" of the mask used. Negative resists generally behave in an opposing manner. Irradiation with light changes the chemical structure so that it becomes less soluble in the developer. When immersed in developer, the non-irradiated resist is washed away, leaving the inverse image or "negative" of the mask used. For brevity of explanation, a positive resist is employed with methodology 300, however a negative or other type of resist can be utilized.

At reference numeral 510, the irradiated resist 430 is patterned, wherein the non-irradiated resist 430 forms a mask to pattern the organic semiconductor 420. At 520, the exposed organic semiconductor 420 is subsequently patterned. Referring now to FIG. 6, the organic semiconductor 420 of the memory device 210 utilized to form a memory cell is illustrated in accordance with an aspect of the present invention. Proceeding to 610, the non-irradiated resist 440 is stripped to expose the organic semiconductor 420, which forms an organic memory element within the memory structure 210. That is, subsequent forming an upper electrode on the remaining organic semiconductor material 420 and applying a voltage between the lower electrode 340 and the upper electrode provides a means to stored and/or erase information to the organic semiconductor 420.

Figure 7:
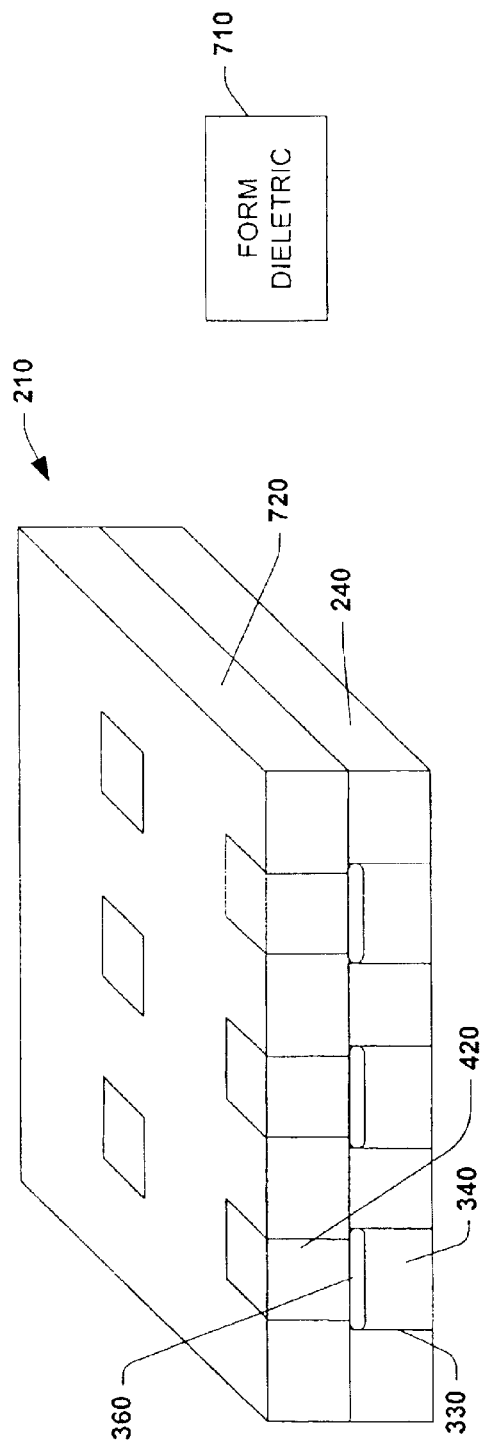
FIG. 7 is a flow diagram and associated structure illustrating a continuation of the process depicted in FIG. 6 for an organic memory structure in accordance with an aspect of the present invention.

Now proceeding to FIG. 7, the addition of a dielectric layer to the memory device 210 is illustrated in accordance with an aspect of the present invention. At 710, a dielectric is formed over the dielectric 320 and the organic semiconductor 420 such that the surface of the organic semiconductor 420 is uncovered. It can be appreciated that the dielectric may initially be formed over a portion and/or substantially the surface of the organic semiconductor 420, and then removed through various techniques until the surface of the organic semiconductor 420 is uncovered. A dielectric is illustrated at 720 of the memory device 210.

Figure 8:
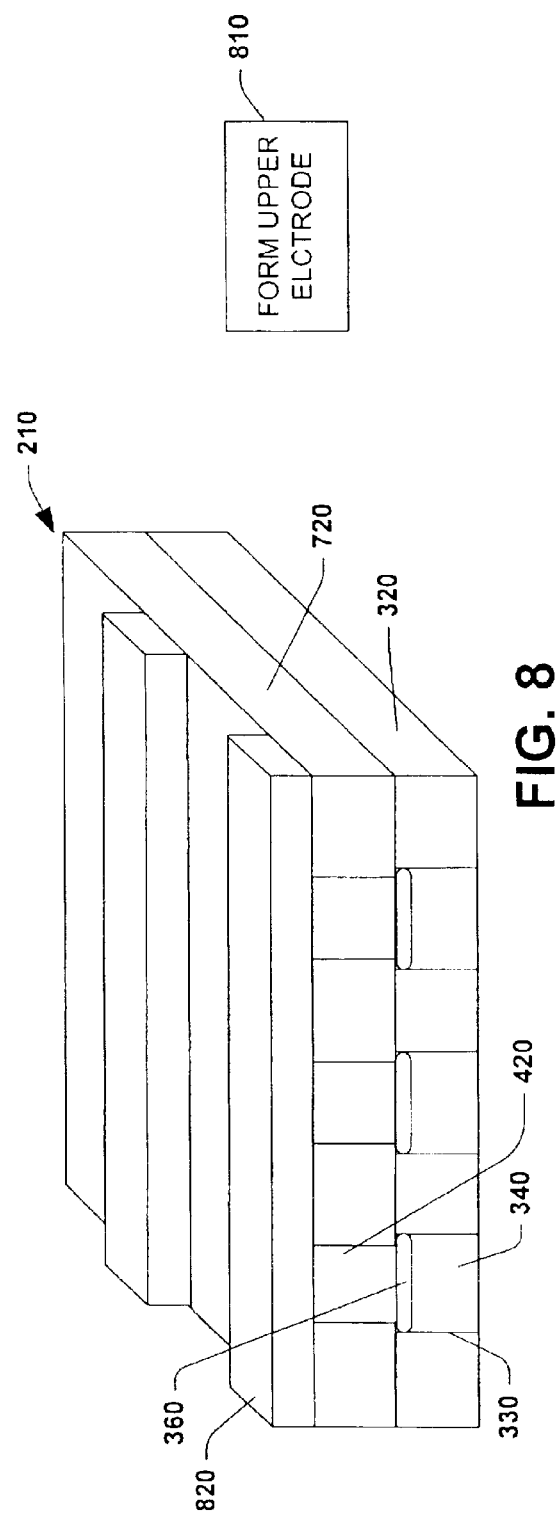
FIG. 8 is a flow diagram and associated structure illustrating a continuation of the process depicted in FIG. 7 for an organic memory structure in accordance with an aspect of the present invention.

FIG. 8 illustrates a formed memory device 210 in accordance with an aspect of the present invention. At 810, an upper electrode is formed over the dielectric 810 and the organic semiconductor 420. An upper electrode is illustrated at 820 in the memory device 210.

In another aspect of the present invention, another dielectric layer(s) can be applied before the upper electrode 820 is formed. For example, a dielectric (not shown) can be deposited over the dielectric 720, and an opening (not shown) can be formed within the dielectric for the upper electrode 820. In addition and similar to the lower electrode 340, the upper electrode 820 can be variously shaped. Furthermore, although the upper electrode 820 is presented perpendicular to the lower electrode 340, other configurations can be employed. For example, the electrodes can be placed at various angles with respect to each other. Other electrode(s) can be formed prior, concurrently or subsequently with the electrode 820.

Figure 9:
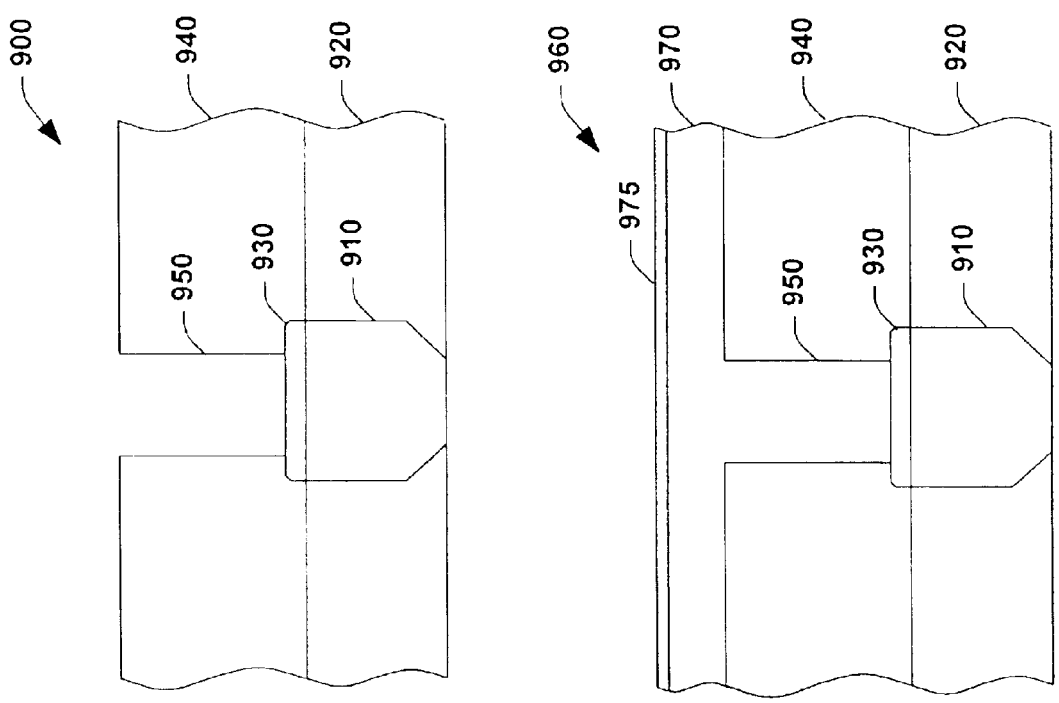
FIG. 9 illustrates a second organic memory device in accordance with an aspect of the present invention.

FIG. 9 illustrates an alternative single cell memory structure that may be formed similarly to the memory structure 210 illustrated in FIGS. 2–8. The following process differs at least in the formation of a second layer that includes a dielectric with an opening wherein a passive element and subsequently a selectively conductive medium are formed within the opening in the dielectric.

A memory structure 900 includes a lower conductive electrode 910 (e.g., bit line) recessed within an ILD layer 920. Thereupon a passive material 930 is formed over the lower conductive electrode 910. An ILD layer 940 is formed over the ILD layer 920 and the passive material 930. A via 950 is formed in the ILD layer 940, over the passive material 930. The via 950 can be formed in accordance with a lithographic etch technique, for example, and/or other process for removing portions of the ILD layer 940.

Figure 10:
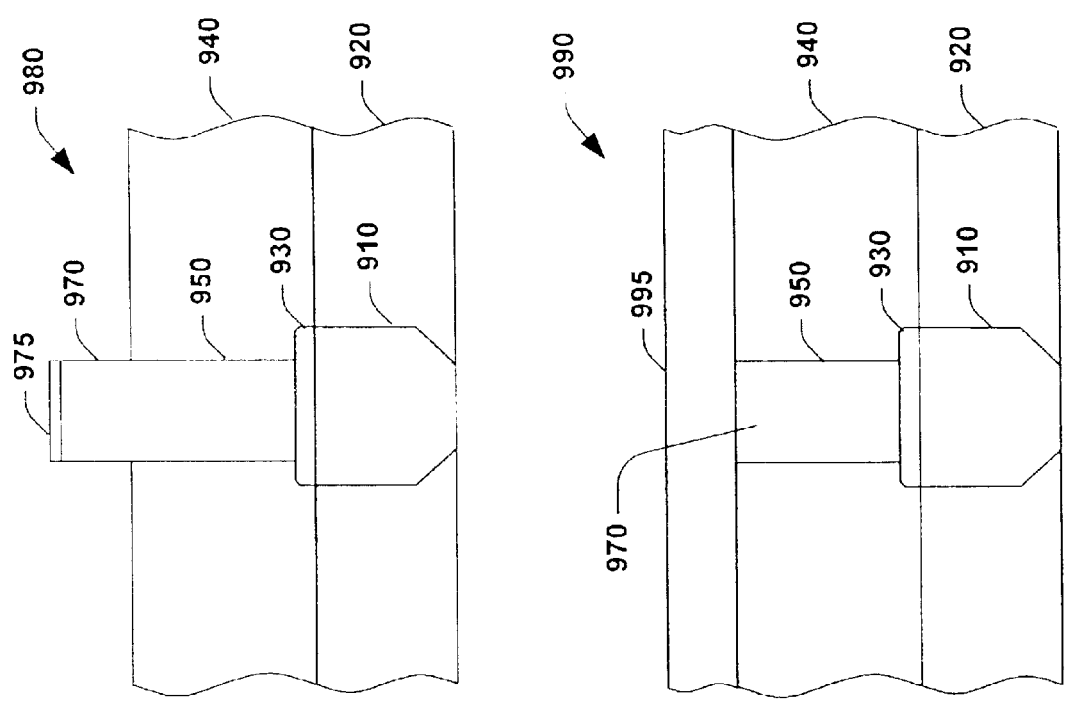
FIG. 10 is a flow diagram and associated structure illustrating a continuation of the process depicted in FIG. 9 in accordance with an aspect of the present invention.

At reference numeral 960, an organic semiconductor 970 is applied to fill the via 950 and cover the ILD 940. A silicon-based resist 975 is then deposited on the organic material 970. Proceeding to FIG. 10, a continuation of FIG. 9 is illustrated in accordance with an aspect of the present invention. At 980, the silicon-based resist 975 is patterned using a suitable technique as previously described. In one aspect, the silicon-based resist 975 and the organic semiconductor 970 are patterned to render the illustrated memory structure portion, wherein the irradiated silicon-based resist 975 and the organic semiconductor 970 beneath the irradiated silicon-based resist 975 are removed and the non-irradiated silicon-based resist 975 and the organic semiconductor 970 beneath the non-irradiated silicon-based resist 975 remain.

At reference numeral 990, the non-irradiated silicon-based resist 975 over the organic semiconductor 970 can then be stripped, and the exposed organic semiconductor 970 can be etched back to a substantially flat surface relative to the ILD 940, for example in accordance with a surface planarization process or chemical mechanical polish (CMP) process.

An upper electrode 995 can then be formed over the organic material 970 and the ILD 940. A barrier (not shown) can be formed between the lower electrode 910 and the ILD 920 in accordance with a single or dual damascene process to substantially prevent conductive material from diffusing into other layers. As an example, the barrier can be formed as a metallic (e.g., tantalum) diffusion barrier. Such barrier materials that can be utilized are cobalt, chromium, nickel, palladium, tantalum, tantalum silicon nitride, titanium, titanium nitride, silicon nitride, tungsten nitride, and tungsten silicon nitride, for example As indicated above, the methods presented can be employed to fabricate single and multi-celled organic memory devices, including multi-celled organic memory devices that comprise multiple organic memory cells within an organic memory structure and/or multiple organic memory structures coupled together. Typically, a partitioning component is employed when multiple memory structures are coupled to provide selective memory cell programming and/or access by applying suitable forward and/or reverse bias voltages. Respective partitioning components can be formed, wherein various threshold voltages enable the partitioning component to conduct in the forward and reverse directions. Examples of partitioning components include a thin-film diode (TFD) a zener diode, a light emitting diode (LED), a transistor, a thin-filmed transistor (TFT), a silicon controlled rectifier (SCR), a uni-junction transistor (UJT), a field effect transistor (FET) and the like.

Figure 11:
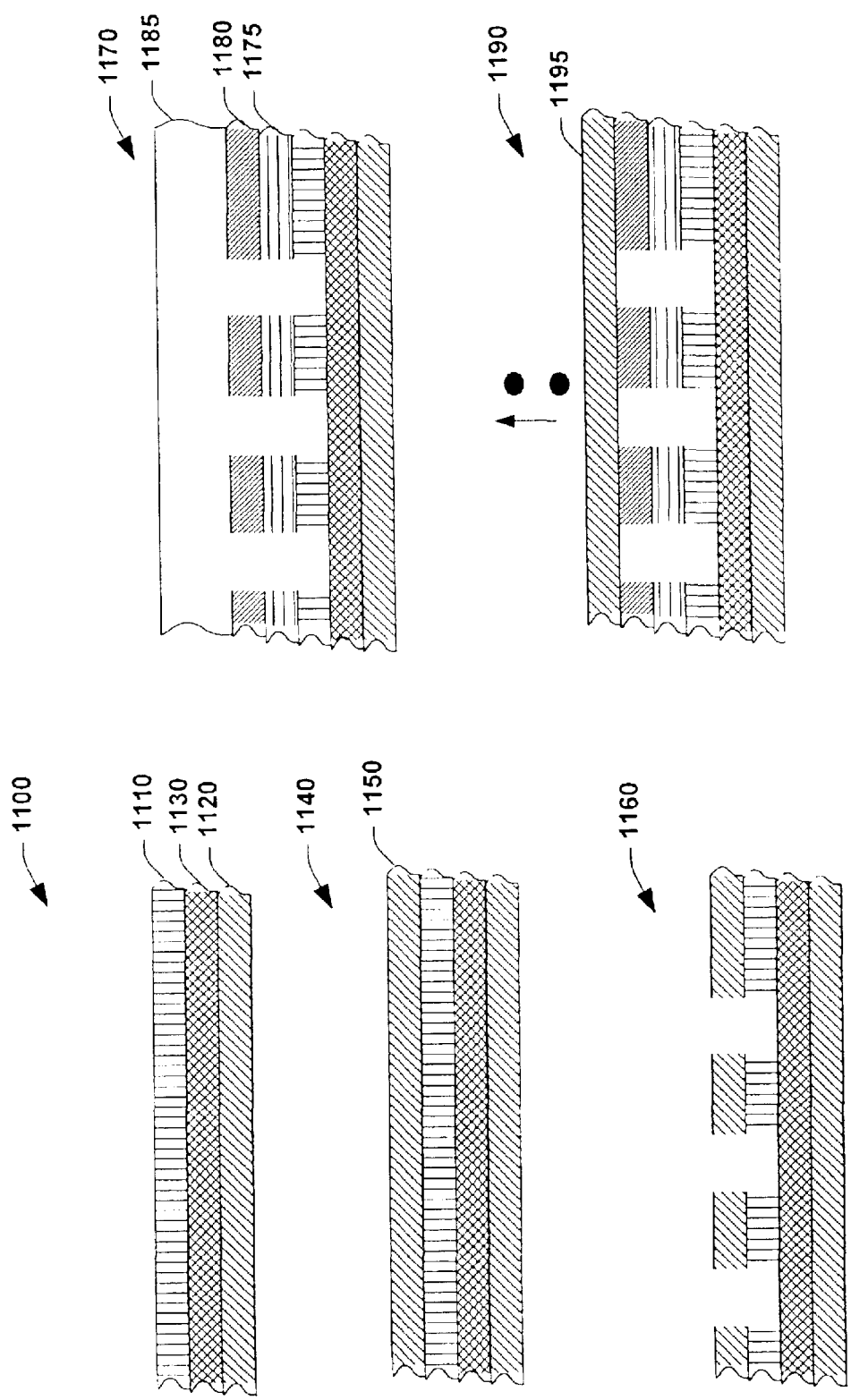
FIG. 11 is a diagram illustrating a memory device in accordance with an aspect of the present invention.

FIG. 11 illustrates a memory structure 1100 employing a partitioning component (e.g., on a substrate) to couple multi-celled memory structures in accordance with an aspect of the present invention. It is appreciated that exemplary materials and process steps will be described herein; however, the present invention is not limited to the exemplary materials and process described.

At 1100, a programmable conducting polymer 1110 is spun on to a Cu bit line 1120 that has been exposed to $Cu_2S$ previously illustrated at 1130, the layers 1110–1130 collectively having a thickness of about 300 Å–5000 Å. At 1140, a silicon-based resist 1150 is spun on, and after a mask is positioned, the silicon-based resist 1150 is irradiated with a suitable energy. At 1160, the silicon-based resist 1150 and the conducing polymer 1110 beneath the irradiated silicon-based resist are pattered.

At 1170, the non-irradiated silicon-based resist 1150 is then removed, and a top electrode 1175 and a thin film diode (TFD) 1180 are then deposited on the conducing polymer 1110. A dielectric 1185 is then deposited in the openings between the stacks of the conducing polymer 1110, the top electrode 1175 and the TFD 1180. Application of the dielectric 1185 can be a two-part process including a low deposition rate conformal dielectric followed by a fast deposition dielectric deposition. The deposition can be CVD or spin-on, for example.

At 1190, the dielectric 1185 is planarized to the surface of the TFD 1180. A word line 1195 is then formed over the TFD 1180. A subsequent stack can then be formed over the word line 1195. If desired, the above process can be repeated to produce a plurality of stacked memory cells in accordance with the present invention.

FIGS. 12–16 illustrate alternative materials and processes that may be employed in accordance with an aspect of the present invention. Accordingly, such components that have been previously described such as electrodes, conductive materials, passive layers, organic materials/layers, and processes for fabricating the same will now be described in more detail and in accordance with alternative aspects of the present invention.

Figure 12:
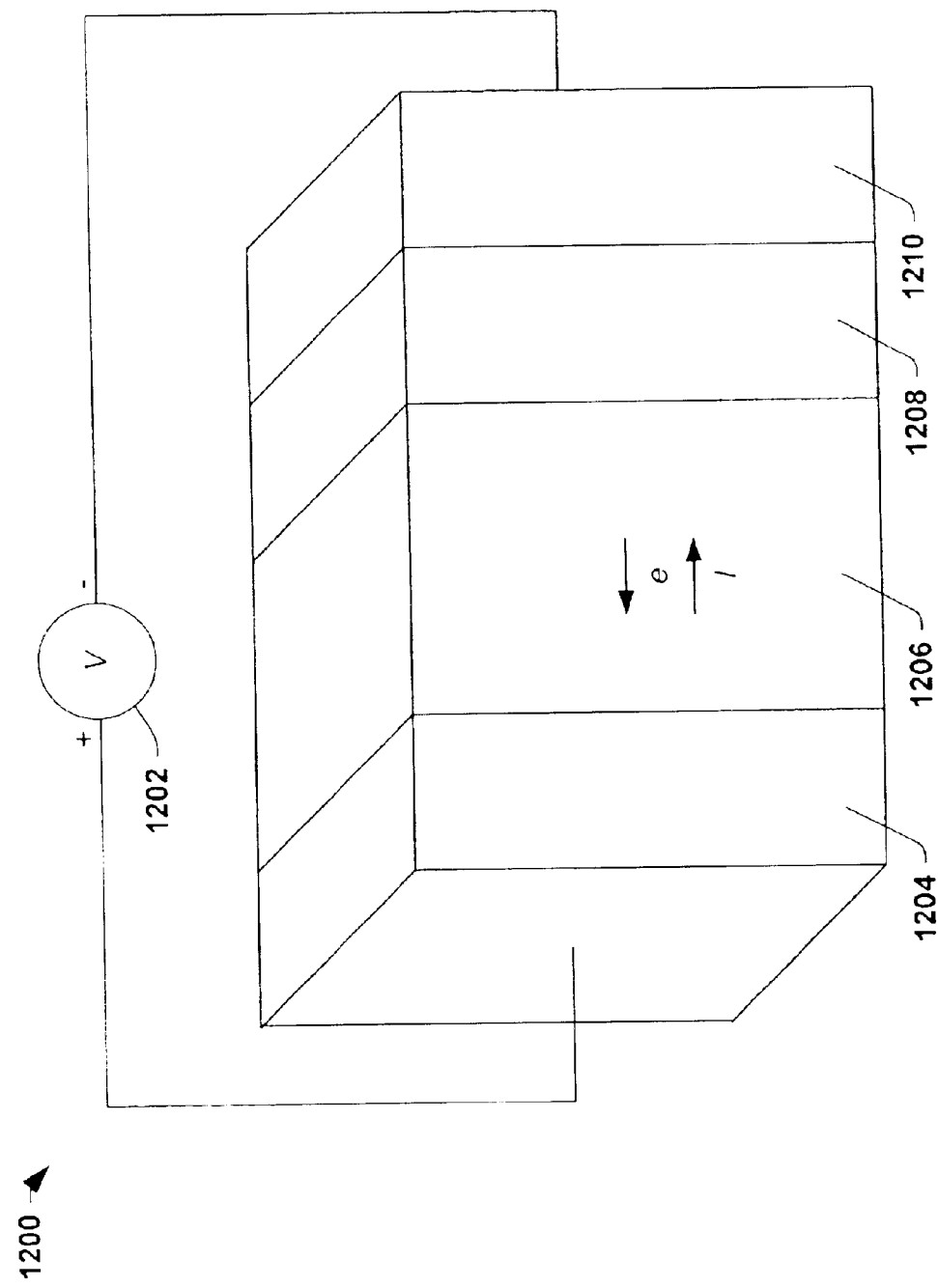
FIG. 12 is a 3-D diagram of an organic memory device in accordance with an aspect of the present invention.

Referring to FIG. 12, a 3-D diagram of an organic memory device 1200 in accordance with an aspect of the present invention is depicted. The memory device includes a first electrode 1204, an organic polymer layer 1206, a passive layer 1208 and a second electrode 1210. The diagram also illustrates a voltage source 1202 connected to the first electrode 1204 and the second electrode 1210 that applies a voltage on the first electrode 1204 and the second electrode 1210. For illustrative purposes, a single first electrode is described. It is to be appreciated however that multiple electrodes having similar properties as the first electrode 1204 can be provided in a multi-cell organic memory as previously described above.

The first electrode 1204 (or multiple first electrodes) and the second electrode 1210 are comprised of a conductive material such as, copper, copper alloy, or silver alloy. Other materials can be aluminum, chromium, germanium, gold, magnesium, manganese, indium, iron, nickel, palladium, platinum, titanium, titanium nitride, tungsten, zinc, alloys thereof, indium-tin oxide, polysilicon, doped amorphous silicon and metal suicides. Exemplary alloys that can be utilized for the conductive material include copper-silver alloy, copper-zinc alloy. Other materials can be Hastelloy®, Kovar®, Invar, Monel®, Inconel®, brass, stainless steel, magnesium-silver alloy, and various other alloys.

The thickness of the first electrode 1204 and the second electrode 1210 can vary depending on the implementation and the memory device being constructed. However, some exemplary thickness ranges include about 0.01 μm or more and about 10 μm or less, about 0.05 μm or more and about 5 μm or less, and/or about 0.1 μm or more and about 1 μm or less.

The organic layer 1206 and the passive layer 1208 are collectively referred to as a selectively conductive media or selectively conductive layer. The conductive properties of this media (e.g., conductive, non-conductive, semi-conductive) can be modified in a controlled manner by applying various voltages across the media via the electrodes 1204 and 1210.

The organic layer 1206 is comprised of a conjugated organic material. If the organic layer is polymer, a polymer backbone of the conjugated organic polymer may extend lengthwise between the electrodes 1204 and 1210 (e.g., generally substantially perpendicular to the inner, facing surfaces of the electrodes 1204 and 1210). The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity-facilitating compound.

The organic material may be cyclic or acyclic. For some cases, such as organic polymers, the organic material self assembles between the electrodes during formation or deposition. Examples of conjugated organic polymers include one or more of polyacetylene; polyphenylacetylene; poly-diphenylacetylene; polyaniline; poly (p-phenylene vinylene); polythiophene; polyporphyrins; porphyrinic macrocycles, thiol derivatized polyporphyrins; polymetallocenes such as polyferrocenes, polyphthalocyanines; polyvinylenes; polypyrroles; and the like. Additionally, doping with a suitable dopant (e.g., salt) modifies the properties of the organic material.

The organic layer 1206 has a suitable thickness that depends upon the chosen implementations and/or the memory device being fabricated. Some suitable exemplary ranges of thickness for the organic polymer layer 1206 are about 0.001 μm or more and about 5 μm or less, about 0.01 μm or more and about 2.5 μm or less, and about a thickness of about 0.05 μm or more and about 1 μm or less.

The organic layer 1206 can be formed via a number of suitable techniques. One suitable technique that can be utilized is a spin-on technique, which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. It may have a chemical bond formed between the conjugated organic polymer and the passive layer 1208.

The passive layer 1208 contains at least one conductivity-facilitating compound that contributes to the controllably conductive properties of the selectively conductive media. The conductivity-facilitating compound has the ability to donate and accept charges (holes and/or electrons). Generally, the conductivity-facilitating compound has at least two relatively stable oxidation-reduction states. The two relatively stable states permit the conductivity-facilitating compound to donate and accept charges and electrically interact with the organic layer 1206. The particular conductivity-facilitating compound employed is selected so that the two relatively stable states match with the two relatively stable states of the conjugated organic molecule of the layer 1206.

The passive layer 1208 can in some instances act as a catalyst when forming the organic layer 1206. In this connection, the backbone of the conjugated organic molecule may initially form adjacent the passive layer 1208, and grow or assemble away and substantially perpendicular to the passive layer surface. As a result, the backbones of the conjugated organic molecule may be self-aligned in a direction that traverses the two electrodes.

Examples of conductivity facilitating compounds that may make up the passive layer 1208 include one or more of copper sulfide ($Cu_{2-x}S_y$, CuS), copper oxide (CuO, $Cu_2O$), manganese oxide ($MnO_2$), titanium dioxide ($TiO_2$), indium oxide ($I_3O_4$), silver sulfide ($Ag_{2-x}S_2$, AgS), silver-copper-sulfide complex ($Ag_yCu_{2-x}S_2$), gold sulfide ($AU_2S$, AuS), cerium sulfate ($Ce(SO_4)_2$), ammonium persulfate (($NH_4)_2S_2O_8$), iron oxide ($Fe_3O_4$), lithium complexes ($Li_xTiS_2$, $Li_xTiSe_2$, $Li_xNbSe_3$, $Li_xNb_3Se_3$), palladium hydride ($H_xPd$) (where x and y are selected to produce desired properties), and the like. The passive layer 1208 may be grown using oxidation techniques, formed via gas phase reactions, or deposited between the electrodes.

The passive layer 1208 has a suitable thickness that can vary based on the implementation and/or memory device being fabricated. Some examples of suitable thicknesses for the passive layer 1208 are as follows: a thickness of about 2 Å or more and about 0.1 μm or less, a thickness of about 10 Å or more and about 0.01 μm or less, and a thickness of about 50 Å or more and about 0.005 μm or less.

In order to facilitate operation of the organic memory device, the organic layer 1206 is generally thicker than the passive layer 1208. In one aspect, the thickness of the organic layer is from about 0.1 to about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 1210 through the selectively conductive media to the first electrode 1204 based on a voltage applied to the electrodes by the voltage source 1202 if the organic layer is n-type conductor. Alternately, holes flow from the first electrode 1204 to second electrode 1210 if the organic layer 1206 is p-type conductor, or both electrons and holes flow in the organic layer if it can be both n and p type with proper energy band match with 1208 and 1210. As such, current flows from the first electrode 1204 to the second electrode 1210 via the selectively conductive media.

Switching the organic memory device to a particular state is referred to as programming or writing. Programming is accomplished by applying a particular voltage (e.g., 0.9 volts, 0.2 volts, 0.1 volts, . . . ) across the selectively conductive media via the electrodes 1204 and 1210. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the organic memory device, the thickness of the various layers, and the like. The voltage supply 1202 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 1 volts; 0.5 volts, 0.1 volts) is applied via the voltage source 1202. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

FIG. 13 is a block diagram that depicts fabrication of a passive layer 1300 in accordance with an aspect of the present invention. A $Cu_{2-x}S_y$ layer is formed by a gas phase reaction operation. A first layer 1306 is formed that comprises Cu. A second layer 1304 is formed on the first layer. The second layer comprises $Cu_{2-x}S_y$ (e.g., $Cu_{2-x}S_y$, CuS or mixture thereof) and has a thickness of about 20 Å or more. A third layer 1102 is formed on the second layer 1304. The third layer 1302 contains $Cu_2O$, and/or CuO and generally has a thickness of about 10 Å or less. It is appreciated that alternate aspects of the invention can employ suitable variations in composition and thickness and still be in accordance with the present invention.

FIG. 14 is a block diagram illustrating an organic layer 1400 formed by a chemical vapor deposition (CVD) process in accordance with an aspect of the present invention. The organic layer 1400 is formed via a gas phase reaction process. Typically, the organic layer 1400 is formed in contact with a passive layer and an electrode. The organic layer 1400 is comprised of polymer polydiphenylacetylene (DPA). This polymer layer is fabricated to be about 65–105 Å thick.

Figure 15:
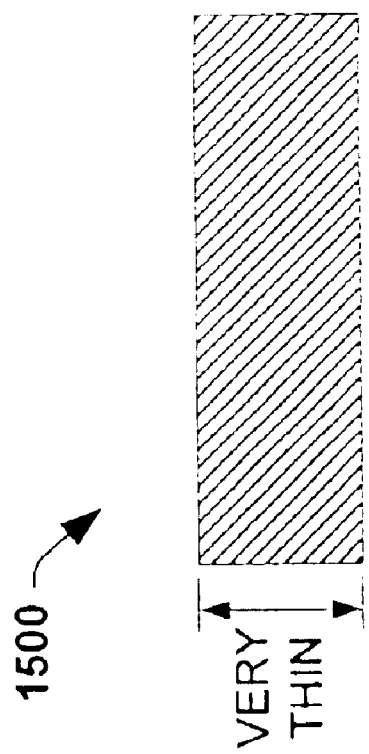
FIG. 15 is a block diagram illustrating another organic polymer layer formed by a CVD process in accordance with an aspect of the present invention.

Turning now to FIG. 15, a block diagram depicting another organic layer 1500 formed from a CVD process in accordance with an aspect of the present invention is illustrated. Once again, the organic layer 1500 is formed via a gas phase reaction process. The organic layer 1500 is formed in contact with a passive layer and an electrode. The organic polymer layer 1500 is comprised of polymer polyphenylacetylene (PPA).

Figure 16:
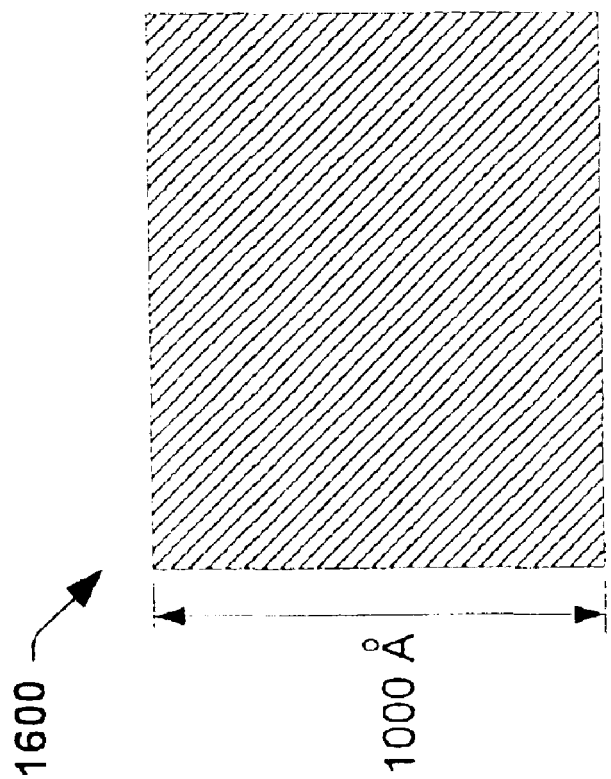
FIG. 16 is a block diagram of yet another organic polymer layer formed by a CVD process in accordance with an aspect of the present invention.

Referring to FIG. 16, a block diagram of another organic layer 1600 formed by spin coating in accordance with an aspect of the present invention is illustrated. The organic layer 1400 is formed via a spin coating process, instead of a gas phase reaction process. The organic layer 1600 is formed in contact with a passive layer and an electrode. The organic layer 1600 is comprised substantially of PPA and has a thickness of about 1000 Å. It is appreciated that various alternatives to and variations of the layers described in FIGS. 12–16 can be employed in accordance with the present invention.

What have been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in the detailed description and/or the claims, such term is intended to be inclusive in a manner similar to the term "comprising."

What is claimed is:

1. A method of processing an organic memory device, comprising:

forming an electrode on a substrate;

forming an organic semiconductor layer, comprising an organic polymer, over the electrode;

depositing a silicon-based resist layer over the organic semiconductor layer;

patterning the silicon-based resist layer, and using the patterned silicon-based resist layer as a mask, patterning the organic semiconductor layer.

2. The method of claim 1, further comprising depositing a passive material over the electrode.

3. The method of claim 1, wherein the silicon-based resist layer is deposited by spin-on techniques.

4. The method of claim 1, wherein patterning the organic semiconductor layer comprises contacting an oxygen plasma with the organic semiconductor layer.

5. The method of claim 1, wherein the silicon-based resist layer is patterned using an organic solvent or a hydroxide solution.

6. The method of claim 1, further comprising forming a second electrode over the patterned organic semiconductor layer to form an organic memory cell.

7. The method of claim 1, wherein the silicon-based resist layer comprises one of a polysiloxane and a silsesquioxane.

8. The method of claim 1, wherein pattering the silicon-based resist layer comprises irradiating the silicon-based resist layer with light having a wavelength of about 248 nanometers or less.

9. The method of claim 1, wherein the organic polymer comprises at least one of polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polypyrroles.

10. The method of claim 2, wherein the passive material comprises copper sulfide.

11. The method of claim 1, further comprising forming a partitioning component on the substrate.

12. The method of claim 11, the partitioning component comprises at least one of a diode, a thin-filmed diode (TFD), a zener diode, an LED, a transistor, a thin-filmed transistor (TFT), a Silicon Controlled Rectifier (SCR), Uni Junction Transistor (UJT), and a Field Effect Transistor (FET).

13. The method of claim 1, the method comprising using at least one of a single and dual damascene process.

14. A system to produce an organic memory device, comprising:

means for forming an organic semiconductor layer over an electrode;

means for applying a silicon-based resist layer over the organic semiconductor layer;

means for patterning the silicon-based resist layer, and means for patterning the organic semiconductor layer.

15. The system of claim 14, further comprising depositing a passive material over the electrode, wherein the passive material comprises copper sulfide.

16. The system of claim 14, wherein the silicon-based resist layer comprises one of a polysiloxane and a silsesquioxane.

17. The method of claim 14, wherein patterning the silicon-based resist layer comprises irradiating the silicon-based resist layer with light having a wavelength of about 248 nanometers or less.

18. The method of claim 14, further comprising forming a second electrode over the patterned organic semiconductor layer to form an organic memory cell.

19. The method of claim 14, wherein patterning the organic semiconductor layer comprises contacting an oxygen plasma with the organic semiconductor layer.

20. A method of forming an organic memory device, comprising:

forming a first electrode using a damascene process;

forming a passive material over the first electrode;

forming an organic semiconductor material on the passive material;

forming a silicon-based resist layer over the organic semiconductor material;

developing the silicon-based resist layer to expose a portion of the organic semiconductor material;

etching the exposed portion of the organic semiconductor material, and forming a second electrode over the organic semiconductor material to operatively couple the first electrode and the second electrode.

21. A method of processing an organic memory device, comprising:

forming an electrode on a substrate;

forming an organic polymer semiconductor layer over the electrode;

depositing a silicon resist layer over the organic polymer semiconductor layer;

patterning the silicon resist layer, and patterning the organic polymer semiconductor layer, using the patterned silicon resist layer as a mask, wherein the patterning technique selectively discriminates between unmasked organic polymer and the silicon-based mask to remove the unmasked organic polymer.

* * * * *